United States Patent
Ito et al.

(10) Patent No.: US 6,200,830 B1
(45) Date of Patent: Mar. 13, 2001

(54) FABRICATION PROCESS OF A SEMICONDUCTOR DEVICE

(75) Inventors: Satoshi Ito; Makoto Kuwamura; Masaki Mizutani; Hiroshi Noro, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/332,949

(22) Filed: Jun. 15, 1999

(30) Foreign Application Priority Data

Jun. 16, 1998 (JP) .................................................. 10-168994

(51) Int. Cl.$^7$ .................................................. H01L 21/44
(52) U.S. Cl. ............................................. 438/106; 438/106
(58) Field of Search ............................... 438/106, 108, 438/111, 112, 118, 122, 123, 124, 127, 121, 125, 126, 115

(56) References Cited

U.S. PATENT DOCUMENTS

| 5,406,124 | * | 4/1995 | Morita et al. | 257/783 |
| 5,594,275 | * | 1/1997 | Kwon et al. | 257/686 |
| 5,641,997 | * | 6/1997 | Ohta et al. | 257/788 |
| 5,940,688 | * | 8/1999 | Higuchi et al. | 438/127 |
| 6,014,318 | * | 1/2000 | Takeda | 361/764 |
| 6,046,077 | * | 4/2000 | Baba | 438/127 |

\* cited by examiner

*Primary Examiner*—David Nelms
*Assistant Examiner*—David Nhu
(74) *Attorney, Agent, or Firm*—Sughrue, Mion, Zinn, Macpeak & Seas, PLLC (57) ABSTRACT

Described is a process for the fabrication of a semiconductor device, which comprises a step of simultaneously or successively mounting at least one semiconductor element having a connecting electrode portion onto each of both sides of an interconnection circuit substrate through an encapsulating resin layer and a step of connecting said at least one semiconductor element with an interconnection electrode on each of both sides of said interconnection circuit substrate by making use of the adhesive force of said encapsulating resin layer.

7 Claims, 5 Drawing Sheets

FABRICATION PROCESS OF A SEMICONDUCTOR DEVICE

FIELD OF THE INVENTION

This invention relates to a process for the fabrication of a semiconductor device comprising mounting a semiconductor element on both sides of a mother board or daughter board in a face-down structure.

BACKGROUND OF THE INVENTION

As a result of a recent request for the improvement in the performance of a semiconductor device, a process (flip chip method, direct chip attach method or the like) for mounting a semiconductor element on a mother board or daughter board having an interconnection circuit formed thereon has attracted attentions. Such a process is presumed to overcome the problems derived from the conventionally employed method, for example, a process for mounting a semiconductor element on a mother board or daughter board after forming a contact on a lead frame through a metal wire from a semiconductor device and being packaged.

The device having said semiconductor element mounted on the mother board or daughter board, on which an interconnection circuit has been formed, in a face-down structure is required to meet a tendency to higher integration of a semiconductor device. As one example which can meet such a request, a semiconductor device having a semiconductor element mounted, in a face-down structure, on both sides of an interconnection circuit substrate such as mother board or daughter board is considered.

Figure 9:
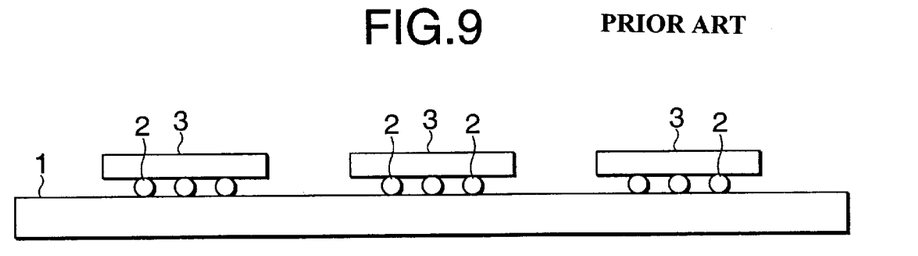
FIG. 9 is a schematic view illustrating a fabrication step of a double-side mounted type semiconductor device.
Figure 10:
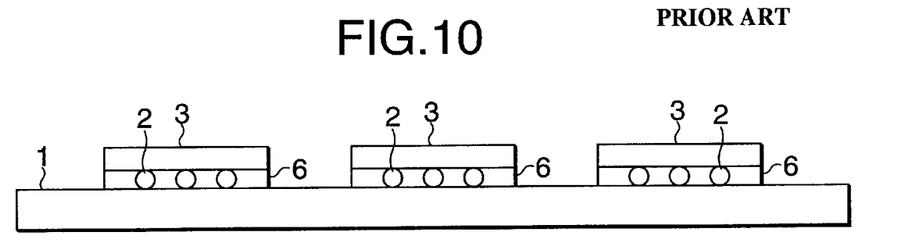
FIG. 10 is a schematic view illustrating a production step of a double-side mounted type semiconductor device.

As the fabrication process of a semiconductor device having a semiconductor element mounted on both sides, a process through the steps as described below can be conceived by way of example. Namely, as illustrated in FIG. 9, after subjecting at least one of one side of an interconnection circuit substrate 1 having an interconnection electrode formed on both sides thereof and a semiconductor element 3 having a connecting electrode portion 2 to flux treatment, the semiconductor element 3 having the connecting electrode portion 2 is mounted at a predetermined position on said one side of the interconnection circuit substrate 1. At the same time, the interconnection electrode on the interconnection circuit substrate 1 and the connecting electrode portion 2 are connected by melting said connecting electrode portion 2, whereby the semiconductor element 3 is fixed onto the interconnection circuit substrate 1 (flip chip bonding+infrared ray reflow). Then, the flux on the interconnection circuit substrate 1 and/or the semiconductor element 3 is washed (flux washing). After a liquid resin material is poured and filled, as illustrated in FIG. 10, in a space between the interconnection circuit substrate 1 and semiconductor element 3, the whole body is heated to cure the liquid resin material, whereby the space portion is encapsulated with the resin. Indicated at numeral 6 in FIG. 10 is an encapsulating resin layer.

Figure 11:
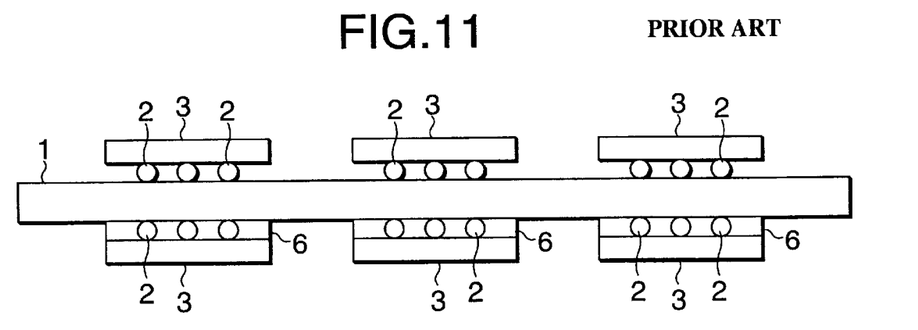
FIG. 11 is a schematic view illustrating a production step of a double-side mounted type semiconductor device.
Figure 12:
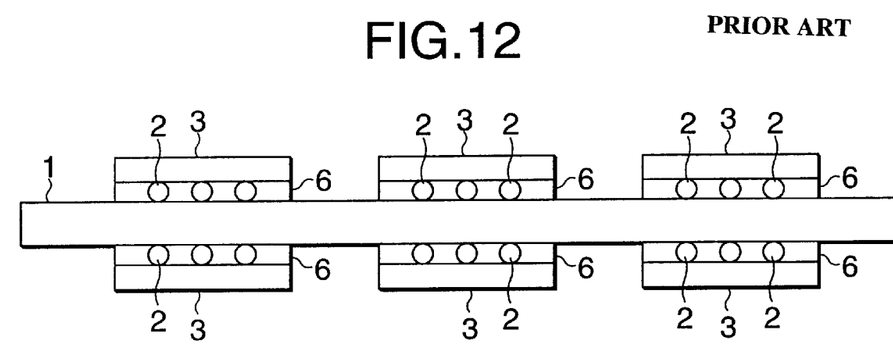
FIG. 12 is a schematic view illustrating a production step of a double-side mounted type semiconductor device.

On the other side of the interconnection circuit substrate 1, another semiconductor element 3 is mounted in a similar step to that described above. Described specifically, as illustrated in FIG. 11, after subjecting at least one of the other side of the interconnection circuit substrate 1 and the another semiconductor element 3 having a connecting electrode portion 2 to flux treatment, the another semiconductor element 3 is mounted at a predetermined position on the other side of the interconnection circuit substrate 1. At the same time, the interconnection electrode on the other side of the interconnection circuit substrate 1 and the connecting electrode portion 2 are connected by melting the connecting electrode portion 2, whereby the another semiconductor element 3 is fixed onto the interconnection circuit substrate 1 (flip chip bonding +infrared ray reflow). Then, the flux on the other side of the interconnection circuit substrate 1 and/or the semiconductor element 3 is washed (flux washing). After the liquid resin material is poured and filled into a space between the other side of the interconnection circuit substrate 1 and the another semiconductor element 3 as illustrated in FIG. 12, the whole body is heated to cure the liquid resin material, whereby the space portion is encapsulated with the resin. Fabrication of a double-side flip chip mounted type semiconductor device having the semiconductor element 3 mounted on both sides of the interconnection circuit substrate 1 in this manner can be considered.

The above-described process is however accompanied with the problem that it needs many steps, which makes the fabrication very troublesome.

SUMMARY OF THE INVENTION

With the foregoing in view, the present invention has been complicated. An object of the present invention is to provide a process for the fabrication of a double-side flip chip mounted type semiconductor device without troublesome steps.

With a view to attaining the above object, the process for the fabrication of a semiconductor device according to the present invention has a constitution which comprises simultaneously or successively mounting a semiconductor element having a connecting electrode portion on both sides of an interconnection circuit substrate through an encapsulating resin layer and connecting the semiconductor element with an interconnection electrode on each of the both sides of the interconnection circuit substrate by making use of the adhesive force of the encapsulating resin layer.

Namely, a process for the fabrication of a semiconductor device according to the present invention comprises simultaneously or successively mounting a semiconductor element having a connecting electrode portion on both sides of an interconnection circuit substrate through an encapsulating resin layer in the uncured form and connecting the semiconductor element with an interconnection electrode on both sides of the interconnection circuit substrate by making use of the adhesive force of the encapsulating resin layer. This process therefore makes it possible to fabricate a double-side mounted type semiconductor device easily without a troublesome step such as a step of connecting the connecting electrode portion in a molten state with one side of the interconnection circuit substrate and carrying out resin encapsulating and then repeating the above-described operation for the other side of the interconnection substrate. A drastic simplification of processing steps can therefore be actualized.

In the above fabrication process, as a step for mounting the semiconductor element having an interconnection electrode portion on both sides of the interconnection circuit substrate through the encapsulating resin layer, for example, the semiconductor element having an interconnection electrode portion is fixed onto one side of the interconnection circuit substrate through the encapsulating resin layer in the uncured form; and then, another semiconductor element having an interconnection electrode portion is temporarily fixed onto the other side of the interconnection circuit substrate through another encapsulating resin layer in the uncured form. Use of such a temporarily fixing step makes it possible to fabricate a double-side mounted type semiconductor device easily without a troublesome step, whereby a drastic simplification of fabrication steps can be actualized.

Moreover, the present inventors have found during the completion of the present invention that the encapsulating of a space between the interconnection circuit substrate and semiconductor element with a resin can be carried out smoothly without forming voids and the like by using, as the encapsulating resin layer in the uncured form, an encapsulating resin sheet composed of an epoxy resin composition containing a predetermined amount of an inorganic filler having a maximum particle size adjusted to 100 $\mu$m or less.

DETAILED DESCRIPTION OF THE INVENTION

The present invention will hereinafter be described in detail.

Figure 1:
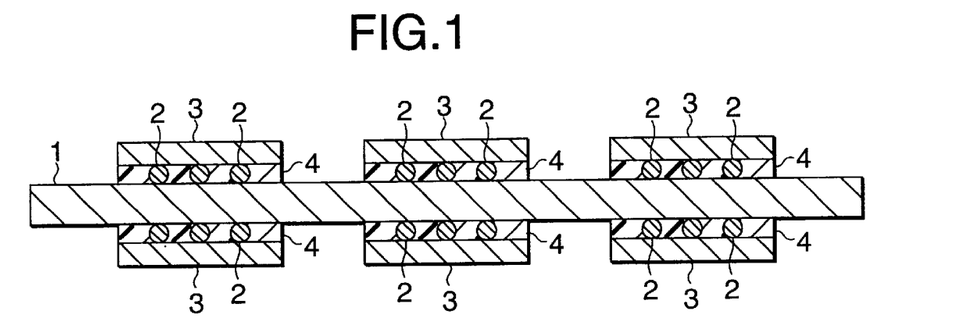
FIG. 1 is a cross-sectional view illustrating one example of the semiconductor device fabricated according to the process of the present invention.

A semiconductor device fabricated by the process of the present invention has, as illustrated in FIG. 1, plural semiconductor elements 3 mounted on each of two sides of an interconnection circuit substrate 1 through connecting electrode portions 2. Between the interconnection circuit substrate 1 and the semiconductor elements 3 mounted on both sides thereof, encapsulating resin layers 4 have been formed.

In FIG. 1, three semiconductor elements 3 are mounted on one side of the interconnection circuit substrate 1, six semiconductor elements in total on both sides. The semiconductor device of the present invention is not limited thereto but to a semiconductor device having at least one semiconductor element 3 on each of the two sides of the interconnection circuit substrate 1. The number of the semiconductor element 3 is determined as needed. The semiconductor device having at least one semiconductor element 3 on each of two sides of the interconnection circuit substrate 1 may be provided for electronic or electric parts as it is or after cut into a piece of the interconnection circuit substrate 1 having at least one semiconductor element 3 on each of the both sides thereof.

The connecting electrode portion 2 for electrically connecting the interconnection circuit substrate 1 with the semiconductor element 3 has been disposed on the surface of the semiconductor element 3 in advance, however, another connecting electrode portion may be disposed on the interconnection circuit substrate 1 in advance. Usually, an interconnection electrode is formed on each of the two sides of the interconnection circuit substrate 1.

In the present invention, the term "connecting electrode portion" may mean only the portion of a known electrode but it may include both the electrode and a conductor attached to the electrode such as joint bump. The interconnection electrode of the interconnection circuit substrate and the connecting electrode portion of the semiconductor element may generally be linked only with an electrode but usually, they are linked with at least one of them being formed of an electrode and a joint bump.

In the ordinary mode, the connecting electrode portion 2 for electrically connecting the interconnection circuit substrate 1 and the semiconductor element 3 has been disposed in advance on the surface of the semiconductor element 3. Other than the connecting electrode portion 2, another connecting electrode portion such as joint bump may be disposed on the interconnection circuit substrate 1 as a part of the interconnection electrode. These connecting electrode portions may each be formed only of an electrode.

Although there is no particular limitation imposed on the material of the above-described plural connecting electrode portions 2 (including joint bump), examples include a gold stud bump, a low-melting point bump and. high-melting point bump, each made of solder, and gold plated bump with a copper•nickel core. Use of the encapsulating resin layer of the present invention makes it possible to control the height of the connecting electrode portion 2 even if it is formed of a material such as the above-described low-melting point solder which loses the original shape at a predetermined temperature. The connecting electrode portion 2 is formed of the above-exemplified material so that a connecting electrode portion made of solder or the like is connected by melting, while that made of a material other than the melting type is connected under pressure.

Although no particular limitation is imposed on the material of the interconnection circuit substrate 1, examples include ceramic substrate and plastic substrates. Specific examples of the plastic substrate include epoxy substrates and bismaleimide triazine substrate. The encapsulating resin layer of the present invention can be used suitably without a limitation even in the case where bonding temperature cannot be set at high, for example, in the combination of a plastic substrate and a connecting electrode portion 2 composed of a low-melting-point solder.

In the present invention, as a material forming the encapsulating resin layer 4, an encapsulating resin layer in the layered form can be used. For example, an. epoxy resin composition in a solid form, more specifically, an encapsulating resin sheet in the uncured form which is composed of the epoxy resin composition and is cured by heating can be used. The term "in the uncured form" as used herein includes semi-cured form. A sheet other than the above-described thermosetting type sheet may be used. Examples of such a sheet include adhesive sheets mainly composed of a thermoplastic resin such as polyphenylene oxide resin, a phenoxy resin or the like. An adhesive sheet composed of an adhesive composition having the above-described thermoplastic resin and a thermosetting resin composition (epoxy resin composition) mixed therein may also be used.

The epoxy resin composition can be obtained using an epoxy resin (component a), a curing agent (component b) and an inorganic filler (component c). It is solid at room temperature. The term "room temperature" as used herein generally means 20° C.

There is no particular limitation imposed on the epoxy resin (component a) insofar as it is in the solid form at room temperature. Examples include biphenyl type epoxy resins and cresol novolac type epoxy resins, of which those having good wetting properties upon melting and low viscosity are more preferred. From the viewpoint of improving wetting properties, particularly preferred are epoxy resins having a structure represented by the below-described formula (1), (2) or (3). They may be used either singly or in combination.

Among the epoxy resins having a structure represented by any one of the above-described formulas (1) to (3), those having an epoxy equivalent of 150 to 230 g/eq and melting point of 60 to 160° C. are preferred. In order to improve the wet ting properties of the resin component, a liquid epoxy resin may be employed partially.

There is no particular limitation imposed on the curing agent (component b) to be used together with the epoxy resin (component a). Various curing agents ordinarily employed, for example, phenolic resins and acid anhydride type curing agents such as methylhexahydrophthalic anhydride can be used, with the phenolic resins being preferably used. As the phenolic resins, phenol novolak and the like can be used, of which those having a low viscosity being preferred. Among them, those having a hydroxyl equivalent of 80 to 120 g/eq and softening point of 80° C. or less are preferred, of which those having a hydroxyl equivalent of 90 to 110 g/eq and softening point of 50 to 70° C. are more preferred, with those having a hydroxyl equivalent of 100 to 110 g/eq and softening point of 55 to 65° C. being particularly preferred. The softening point can be measured according to Japanese Industrial Standard K $5903^{-1978}$, Item 5.3.

Concerning the mixing ratio of the epoxy resin (component a) to the curing agent (component b), when the phenolic resin is employed as a curing agent, the hydroxyl equivalent in the phenolic resin is preferably set within a range of 0.5 to 1.6 relative to one equivalent of the epoxy group in the epoxy resin, with a range of 0.8 to 1.2 being more preferred.

Examples of the inorganic filler (component c) to be used together with the above-described components a and b include conventionally used various inorganic fillers such as silica powder, calcium carbonate and titanium white. Among them, spherical silica powder and ground silica powder are preferred, with spherical silica powder being particularly preferred. As the inorganic filler (component c), that having a maximum particle size of 100 $\mu$m or less wt. % have adverse effects on the properties of the encapsulating resin when cured, particularly increase the linear expansion coefficient, thereby widening the difference in the linear expansion coefficient between the semiconductor element and the encapsulating resin and presumably causing defects such as cracks in the cured resin or semiconductor element. The contents exceeding 90 wt. %, on the other hand, heighten the melt viscosity of the encapsulating resin, thereby deteriorating the filling property.

In the epoxy resin composition to be used in the present invention, in addition to the above-described components a to c, a stress reducing agent such as silicone compound (side-chain ethylene glycol type dimethylsiloxane, etc.) and acrylonitrile-butadiene rubber, a flame retardant, polyethylene, a wax such as carnauba or a coupling agent such as silane coupling agent ($\gamma$-glycidoxypropyl trimethoxysilane, etc.) may be incorporated as needed.

Examples of the flame retardant include brominated epoxy resins, and a flame retardant assistant such as diantimony trioxide is used in combination therewith.

The above-described epoxy resin composition to be used in the present invention is available, for example, as follows. Described specifically, the resin components a is preferred, with that having a maximum particle size of 50 $\mu$m or less being particularly preferred. The powder having the maximum particle size exceeding 100 $\mu$m sometimes cannot fill the space between the interconnection circuit substrate and semiconductor device (the space to be encapsulated with an encapsulating resin layer). In addition, it is preferred to use the inorganic filler having an average particle size of 1 to 20 $\mu$m as well as the above-described maximum particle size, with an average particle size of 2 to 10 $\mu$m being particularly preferred. From such a point of view, the maximum particle size of the inorganic filler (component c) is preferably set at ½ or less of the distance between the interconnection circuit substrate and semiconductor device (the space to be encapsulated with an encapsulating resin layer), with ⅒ to ⅓ being more preferred. By setting the maximum particle size at ½ or less, the encapsulating resin layer in a molten state can be filled between the interconnection circuit substrate and semiconductor device smoothly without causing voids and the like.

The amount of the inorganic filler (component c) is preferably set within a range of 90 wt. % or less, more preferably 20 to 90 wt. %, particularly preferably 55 to 80 wt. %, based on the whole epoxy resin composition. The contents of the inorganic filler (component c) less than 20 and b are mixed in a molten state under heating and the above-described component c and additives, if necessary, are added to the molten resin mixture, followed by mixing. A catalyst is then added to the resulting mixture to adjust its reactivity, whereby a uniform system is formed. After charging the uniform reaction system in a pallet and cooling, it is press-rolled into a resin sheet. Generally, a thixotropic agent is admixed with a composition to restrain the fluidity upon heat at curing. Examples of the thixotropic agent include acrylonitrile-butadiene copolymer and the like.

There is no particular limitation imposed on the above-described catalyst to be incorporated for the adjustment of the reactivity. Conventionally used curing accelerators can be mentioned as examples. Specific examples include triphenylphosphine, tetraphenyl phosphate, tetraphenyl borate and 2-methylimidazole.

The process for mixing the components and forming the sheet is not limited to the above-described one. The components may also be mixed in a twin roll, triple roll or the like, while the sheet may also be formed by rolling or by coating the mixture of the uniform reaction system and a solvent. If the epoxy resin composition is supplied in the tape form, a mass production system by so-called reel to reel can be adopted.

In the present invention, a sheet, that is, an encapsulating resin sheet forming the encapsulating resin layer usually has a thickness of about 5 to 200 μm, preferably about 10 to 120 μm.

The process for the fabrication of a semiconductor device according to the present invention comprises, as described above, upon fabrication of the semiconductor device having a semiconductor element mounted on both sides of an interconnection circuit substrate through a connecting electrode portion, temporarily fixing the semiconductor element on both sides of the interconnection circuit substrate through the encapsulating resin layer simultaneously or successively and then connecting the connecting electrode portion with the interconnection electrode on the interconnection circuit device by heating.

This process of the present invention will hereinafter be described more specifically in due order with reference to accompanying drawings. In the below-described process, an encapsulating resin sheet in the uncured form is employed as a forming material of an encapsulating resin layer. The term "the uncured form" embraces, as described above, "semi-cured form".

Figure 2:
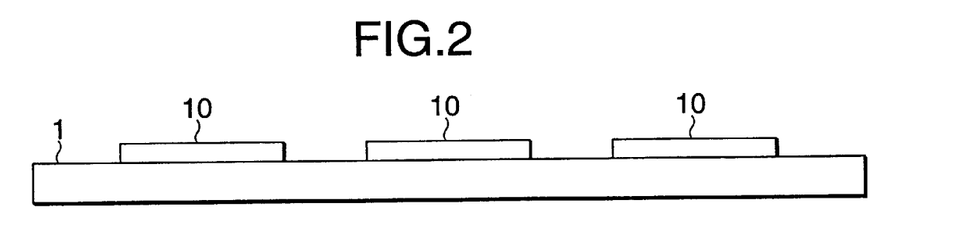
FIG. 2 is a schematic view illustrating a fabrication step which constitutes the fabrication process of the semiconductor device according one embodiment of the present invention.
Figure 3:
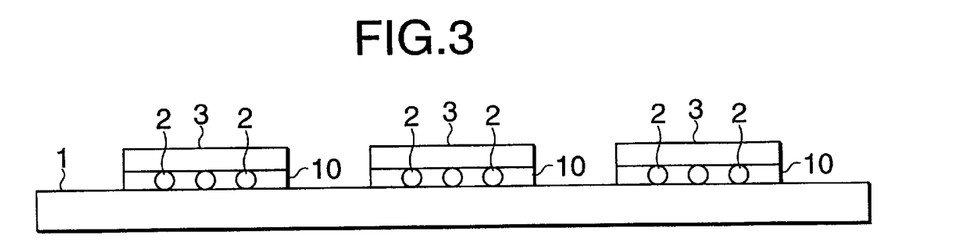
FIG. 3 is a schematic view illustrating a fabrication step which constitutes the fabrication process of the semiconductor device according one embodiment of the present invention.

As illustrated in FIG. 2, an encapsulating resin sheet 10 in the uncured form is placed at a predetermined position on one side of an interconnection circuit substrate 1 having an interconnection electrode disposed thereon (formation of an encapsulating resin layer: first sheet laminating step). As illustrated in FIG. 3, a semiconductor element 3 having a connecting electrode portion 2 is disposed on the encapsulating resin sheet 10 under heating and pressure, whereby the connecting electrode portion 2 is inserted into the encapsulating resin sheet 10; and usually gelation is allowed to progress, thereby bringing the interconnection electrode of the interconnection circuit substrate 1 in contact with the connecting electrode portion 2 of the semiconductor element 3. In this manner, the semiconductor element 3 is temporarily fixed on one side of the interconnection circuit substrate 1 by making use of the adhesive force of, usually, gelation of the encapsulating resin sheet 10 (first flip chip bonding step).

Figure 4:
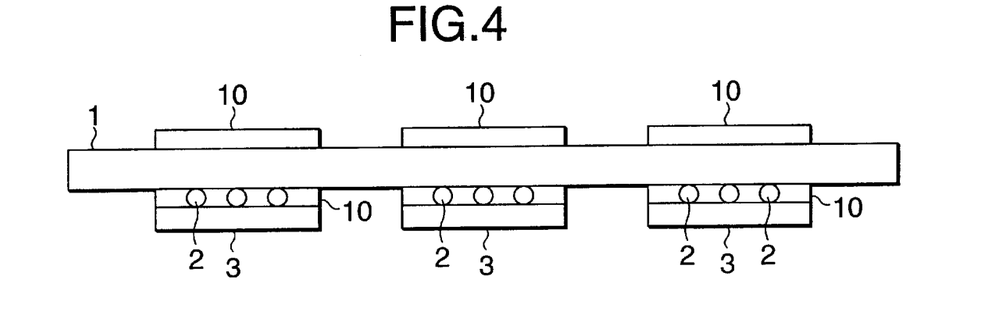
FIG. 4 is a schematic view illustrating a fabrication step which constitutes the fabrication process of the semiconductor device according one embodiment of the present invention.
Figure 5:
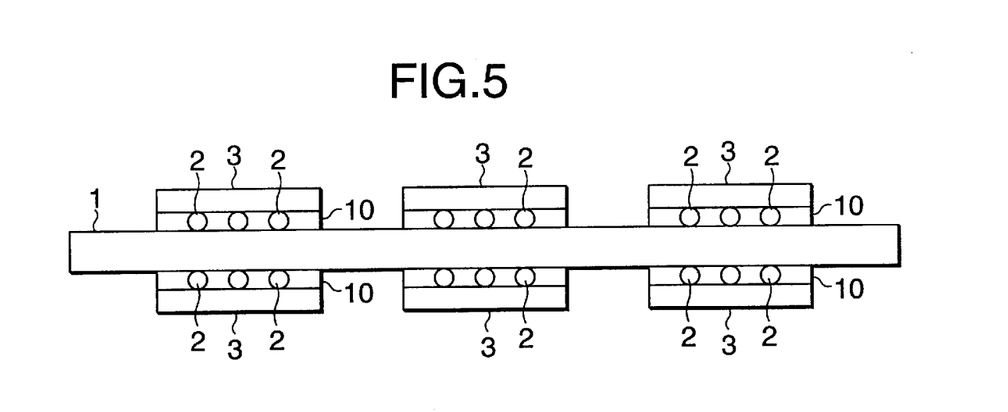
FIG. 5 is a schematic view illustrating a fabrication step which constitutes the fabrication process of the semiconductor device according one embodiment of the present invention.

The other side of the interconnection circuit substrate 1 on which another semiconductor element 3 has not yet been-temporarily fixed is subjected to the step similar to the above. Described specifically, as illustrated in FIG. 4, another encapsulating resin sheet 10 in the uncured form is placed at a predetermined position on the other side of an interconnection circuit substrate 1 (formation of another encapsulating resin layer: second sheet laminating step). As illustrated in FIG. 5, the another semiconductor element 3 having another connection electrode portion 2 is disposed on the another encapsulating resin sheet 10 upon heating and pressure, whereby the another connecting electrode portion 2 is inserted into the another encapsulating resin sheet 10; and usually gelation is allowed to progress, thereby bringing the interconnection electrode of the interconnection circuit substrate 1 in contact with the another connecting electrode portion 2 of the another semiconductor element 3. In this manner, the another semiconductor element 3 is temporarily fixed on the other side of the interconnection circuit substrate 1 by making use of the adhesive force of, usually, gelation of the another encapsulating resin sheet 10 (second flip chip bonding step).

Figure 6:
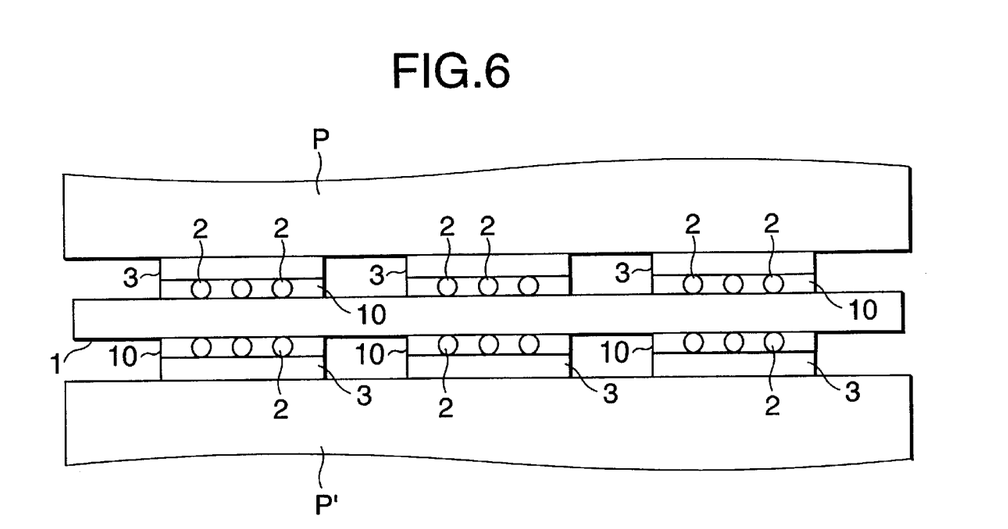
FIG. 6 is a schematic view illustrating a fabrication step which constitutes the fabrication process of the semiconductor device according one embodiment of the present invention.

As illustrated in FIG. 6, the interconnection circuit substrate 1 having a semiconductor element 3 temporarily fixed on both sides thereof is fed to a hot pressing step and heated and preferably pressurized between upper and lower plates P,P' of a hot press, whereby the connecting electrode portion 2 of the semiconductor element 3 temporarily fixed on each of both sides of the interconnection circuit substrate 1 is connected with the interconnection electrode of each of both sides of the interconnection circuit substrate 1 At the same time, the encapsulating resin sheet 10 in the uncured form is cured, thereby encapsulating therewith the space between each of both sides of the interconnection circuit substrate and the semiconductor element temporarily fixed on each side thereof to form an encapsulating resin layer 4. In this manner, the semiconductor device as illustrated in FIG. 1 is fabricated.

The above-described fabrication process is based on a process for temporarily fixing a semiconductor element successively on each of both sides of the interconnection circuit substrate 1, but is not limited thereto. The semiconductor element 3 may be temporarily fixed on each of the two sides of the interconnection circuit substrate 1 simultaneously. The temporary fixing of the semiconductor element 3 on each of both sides of the interconnection circuit substrate 1 is carried out simultaneously by changing and/or setting the apparatuses and conditions properly as needed.

As described above, the interconnection electrode of the interconnection circuit substrate 1 is connected with the connecting electrode portion 2 of the semiconductor element 3 temporarily fixed on each of both sides of the interconnection circuit substrate 1, for example, in a molten state by melting the electrode under heating in the case where the connecting electrode portion 2 is composed of a melting type material such as solder, while under pressure in the case where the connecting electrode portion 2 is composed of a material other than the melting type.

Although, in the above fabrication process, the semiconductor element 3 having plural spherical connecting electrode portions 2 disposed thereon was described, the present invention is not limited thereto. It is also possible to employ an interconnection circuit substrate 1 having plural spherical connecting electrode portions disposed on the interconnection electrode portion.

As the encapsulating resin sheet 10, a sheet-like epoxy resin composition having tackiness at room temperature or higher is preferred, considering that the encapsulating resin sheet 10 is disposed on the interconnection circuit substrate 1 and the semiconductor element 3 is temporarily fixed to each of both sides of the interconnection circuit substrate 1. The size of the encapsulating resin sheet 10 is set as desired depending on the size (area) of the semiconductor element 3 to be disposed. The thickness and, if necessary, the weight of the encapsulating resin sheet 10 are determined as desired by the size of the semiconductor element 3 to be disposed and also the size of the spherical connecting electrode portion 2 to be disposed on the interconnection circuit substrate 1, in other words, by the volume of the encapsulating resin layer 4 formed by filling and encapsulating the space between the semiconductor element 3 and the interconnection circuit substrate 1.

The above-described sheet-like epoxy resin composition having tackiness can be obtained, for example, by preliminary adding a rubber component such as acrylonitrile-butadiene copolymer to an epoxy resin composition.

The above-described sheet-like epoxy resin composition, that is, the encapsulating resin sheet 10 may Abe that having tackiness or that having no tackiness at room temperature. That having no tackiness at room temperature usually becomes gel and exhibits adhesion by heating. Heating conditions, for example, set at 100 to 300° C. are preferred. Pressurizing is carried out at 1 to 30 kg/cm$^2$ relative to the area of the semiconductor element 3 and it can be set as desired depending on the number of the connecting electrode portions 2 disposed on the semiconductor element 3.

In the above-described fabrication process, the heating temperature upon curing the encapsulating resin sheet 10 in the uncured form is preferably set within a temperature range of 70 to 300° C. in consideration of the deterioration of the semiconductor element 3 and interconnection circuit substrate 1 due to heating, with a range of 120 to 200° C. being particularly preferred. In the above process, heating is conducted by a hot press. The heating method is not limited thereto but an infrared reflow oven, drier, hot air heater, heating plate or the like can be used.

Upon heating and melting of the connecting electrode portion 2 of the semiconductor element 3 to connect it with the interconnection electrode of the interconnection circuit substrate 1 under molten state, it is preferred that pressurization is conducted together with heating. The pressurizing conditions are set within a range of 0.05 to 1.0 kg/cm$^2$ relative to the area of the semiconductor element 3.

In addition to the use of the encapsulating resin sheet 10 as described above, print coating of an encapsulating-resin-layer forming material directly onto a predetermined portion of the interconnection circuit substrate 1 can also be mentioned as an example of the method for disposing the encapsulating resin layer on the interconnection circuit substrate 1.

Figure 7:
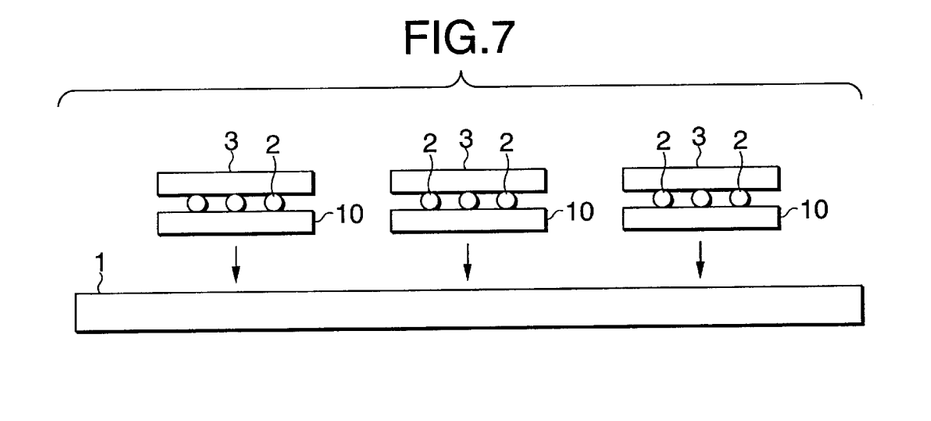
FIG. 7 is a schematic view illustrating a fabrication step which constitutes the fabrication process of the semiconductor device according another embodiment of the present invention.

In the above fabrication process, the encapsulating resin layer is formed on each of the both sides of the interconnection circuit substrate 1 by using the encapsulating resin sheet 10, but is not limited thereto. As illustrated in FIG. 7, for example, the encapsulating resin sheet 10 is laminated on the side having the connecting electrode portion 2 of the semiconductor element 3 disposed thereon and then, the laminated encapsulating resin sheet 10 and one side of the interconnection circuit substrate 1 are faced each other. Under heating and pressure, the interconnection electrode of the interconnection circuit substrate 1 is brought into contact with the connecting electrode portion 2 of the semiconductor element 3 and the encapsulating resin layer (encapsulating resin sheet 10) is gelled, whereby the semiconductor element 3 may be temporarily fixed onto each of both sides of the interconnection circuit substrate 1.

Figure 8:
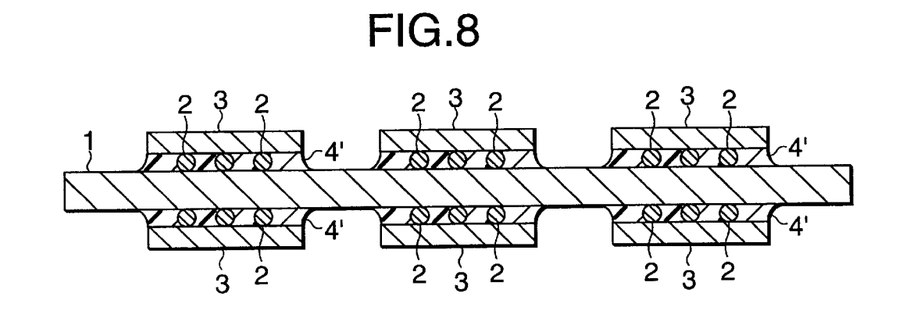
FIG. 8 is a cross-sectional view illustrating another example of the semiconductor device obtained by the fabrication process according to the present invention.

As one example of the semiconductor device fabricated through the above-described steps, a device, as illustrated in FIG. 1, wherein the encapsulating resin layer 4 is formed in such a way that no protrusion would appear around the semiconductor element 3 can be mentioned. A semiconductor device, as illustrated in FIG. 8, wherein the encapsulating resin layer 4' is formed in such a way that protrusion would appear around the semiconductor element 3 can also be employed, though depending on the using purpose of the device.

In the semiconductor device thus fabricated, the size of the semiconductor element 3 is set at 2 to 20 mm wide×2 to 30 mm long×0.2 to 1.0 mm thick. The size of the interconnection circuit substrate 1 having an interconnection circuit formed thereon, on which the semiconductor element 3 is to be mounted, is usually set at 20 to 200 mm wide×50 to 400 mm long×0.05 to 3.0 mm thick. The distance between the semiconductor element 3 and the interconnection circuit substrate 1 wherein the encapsulating resin layer 4 is to be formed is usually 5 to 100 µm. When the properties of the encapsulating resin layer to be used in the present invention are taken into consideration, the distance between them is preferably set at 10 to 70 µm.

As the properties of the encapsulating resin layer 4 formed by encapsulating with the encapsulating resin, that is, the properties of the encapsulating resin, it is preferred that the melt viscosity at each using temperature ranges from 1 to 1000 poises, gelling time at 150° C. ranges from 0.5 to 30 minutes and linear expansion coefficient of the cured resin ranges from 7 to 50 ppm, with the melt viscosity of 1 to 500 poises, gelling time (at 150° C.) of 1.0 to 15 minutes and linear expansion coefficient of 12 to 40 ppm being more preferred. At the melt viscosity set within the above range, good filling property can be attained. The gelation time set within the above range has good effects on the molding or forming workability, particularly on the reduction of the curing time. When the linear expansion coefficient is set within the above range, stress-induced defects of the cured resin or semiconductor such as cracks can be prevented. The above-described melt viscosity was measured by a flow tester viscometer, while the gelation time was measured on a heating plate. The linear expansion coefficient was measured by thermomechanical analysis (TMA).

In the present invention, as described above, the semiconductor element is temporarily fixed under heating and pressure onto each of both sides of the interconnection circuit substrate through the encapsulating resin layer formed by the encapsulating resin sheet or the like, followed by heating and curing the encapsulating resin layer.

By the above-described treatment under pressure, the encapsulating resin is cured while or after the connecting electrode portion such as solder or the like is flattened.

In general, the connecting electrode portion is formed of a thermally flowable material such as solder. It is general to heat the bonded body of the semiconductor element and the interconnection circuit substrate to about 215° C. in order to simultaneously carry out curing of the encapsulating resin layer and melting of the solder which constitutes the connecting electrode portion, whereby the semiconductor device of the present invention is fabricated. The above-described step for simultaneously carrying out melting of a material, such as solder, constituting the connecting electrode portion and curing of the encapsulating resin layer is an ordinarily adopted step.

The bonding of the semiconductor element to the interconnection circuit substrate has been described above, but it is possible to bond, to the interconnection circuit substrate (mother board), a flip chip BGA (ball grid array) through a daughter board instead of the semiconductor element. Thus, in this invention, the concept of the semiconductor element embraces a flip chip BGA (ball grid array) through a daughter board.

In the encapsulating by an encapsulating resin layer such as encapsulating resin sheet or the like in the present invention, the following description can be applied. to most cases.

When solder is used as the connecting electrode portion, the melting-bonding of connecting electrode portion of the semiconductor element and the interconnection electrode of the interconnection circuit substrate is generally carried out suitably even without flux treatment.

The reason is not clear but it is presumed that at a stage when the bonded body of the semiconductor element and the interconnection circuit substrate is formed, solder as the connecting electrode portion is in most cases covered with a cured resin and blocked from oxygen and that cracks appear on the surface of the solder at the time of flattening the electrode portion under pressure and the surface (not oxidized surface) of the solder is exposed. If an encapsulating resin sheet containing a trace amount of at least one of a chlorine component and an organic acid component, for example, a sheet composed of an epoxy resin composition is employed as the encapsulating resin layer, at least one of these chorine and organic acid components is effective for removing the oxidized film formed on the surface of the connecting electrode portion made of solder, which is presumed to be another reason. By heating to about 215° C. under such circumstances, the connecting electrode portion of the semiconductor element and interconnection electrode of the interconnection circuit substrate are melted and connected.

EXAMPLES

A description will next be made of examples together with comparative examples.

Prior to examples, the following components were prepared.

Epoxy Resin a1

Employed was a biphenyl type epoxy resin having a structure represented by the following formula (4):

(4)

epoxy equivalent: 195 g/eq, melting point: 107° C.

Epoxy Resin a2

Employed was a cresol novolak type epoxy resin (epoxy equivalent: 195 g/eq, melting point: 60 to 90° C.).

Curing Agent b

Employed was a phenol novolak resin (hydroxyl equivalent: 105 g/eq, softening point: 60° C.).

Inorganic Fillers c1 to c5

Employed were following spherical silica powders shown in Table 1.

TABLE 1

|  |  | Average particle size (μm) | Maximum particle size (μm) | Appearance |
|---|---|---|---|---|
| Silica powder | c1 | 3 | 18 | spherical |
|  | c2 | 6 | 18 | spherical |
|  | c3 | 6 | 30 | spherical |
|  | c4 | 3 | 18 | ground |
|  | c5 | 15 | 98 | spherical |

Catalyst d1
  triphenylphosphine
Catalyst d2
  A 1:1 mixture (molar ratio) of tetraphenyl phosphate and tetraphenyl borate
Stress Reducing Agent
  Acrylonitrile-butadiene rubber
Flame Retardant
  Brominated epoxyphenol novolak
Flame Retardant Assistant
  Diantimony trioxide
Wax
  Polyethylene
Coupling Agent
  γ-Glycidoxypropyl trimethoxysilane

EXAMPLES 1 to 13

In each of Examples 1 to 13, the above-described components were mixed at the mixing ratios as shown in Tables 2 to 3. The resulting mixture was charged in a pallet and after cooling, was press-rolled into a sheet, whereby the target sheet-like epoxy resin composition was prepared.

TABLE 2

|  |  | Examples |  |  |  |  |  |  |
|---|---|---|---|---|---|---|---|---|
|  |  | 1 | 2 | 3 | 4 | 5 | 6 | 7 |
| Epoxy resin | a1 | 19 | 19 | 19 | — | 19 | 19 | 19 |
|  | a2 | — | — | — | 19 | — | — | — |
| Curing agent | b | 11 | 11 | 11 | 11 | 11 | 11 | 11 |
| Silica powder | c1 | 89 | — | — | 89 | — | 480 | — |
|  | c2 | 89 | — | — | — | — | — | — |
|  | c3 | — | — | 89 | — | — | — | — |
|  | c4 | — | — | — | — | 89 | — | — |
|  | c5 | — | — | — | — | — | — | 89 |
| Catayst | d1 | 1 | 1 | 1 | 1 | 1 | 1 | 1 |
|  | d2 | — | — | — | — | — | — | — |
| Stress reducing agent |  | 20 | 20 | 20 | 20 | 20 | 20 | 20 |
| Flame retardant |  | 2.5 | 2.5 | 2.5 | 2.5 | 2.5 | 2.5 | 2.5 |
| Flame retardant assistant |  | 5.0 | 5.0 | 5.0 | 5.0 | 5.0 | 5.0 | 5.0 |
| Wax |  | 0.5 | 0.5 | 0.5 | 0.5 | 0.5 | 0.5 | 0.5 |
| Coupling agent |  | 0.3 | 0.3 | 0.3 | 0.3 | 0.3 | 0.3 | 0.3 |

TABLE 3

|  |  | Examples |  |  |  |  |  |
|---|---|---|---|---|---|---|---|
|  |  | 8 | 9 | 10 | 11 | 12 | 13 |
| Epoxy resin | a1 | — | — | — | — | 18 | — |
|  | a2 | 19 | 19 | 19 | 19 | — | 18 |
| Curing agent | b | 11 | 11 | 11 | 11 | 11 | 11 |
| Silica powder | c1 | 237 | 40 | 20 | 0 | 89 | 89 |
|  | c2 | — | — | — | — | — | — |
|  | c3 | — | — | — | — | — | — |

TABLE 3-continued

|  |  | Examples | | | | | |
|---|---|---|---|---|---|---|---|
|  |  | 8 | 9 | 10 | 11 | 12 | 13 |
|  | c4 | — | — | — | — | — | — |
|  | c5 | — | — | — | — | — | — |
| Catayst | d1 | 1 | 1 | 1 | 1 | — | — |
|  | d2 | — | — | — | — | 2 | 2 |
| Stress reducing agent |  | 20 | 30 | 30 | 40 | 20 | 20 |
| Flame retardant |  | 2.5 | 2.5 | 2.5 | 2.5 | 2.5 | 2.5 |
| Flame retardant assistant |  | 5.0 | 5.0 | 5.0 | 5.0 | 5.0 | 5.0 |
| Wax |  | 0.5 | 0.5 | 0.5 | 0.5 | 0.5 | 0.5 |
| Coupling agent |  | 0.3 | 0.3 | 0.3 | 0.3 | 0.3 | 0.3 |

Using each of the sheet-like epoxy resin compositions (encapsulating resin sheets) thus prepared in Examples, a semiconductor device was fabricated in accordance with the above described process. Described specifically, as illustrated in FIG. 2, the encapsulating resin sheet 10 in the uncured form having a thickness of 80 μm was placed at a predetermined position of one side of the interconnection circuit substrate 1 (thickness: 1.5 mm, material: epoxy laminate plate, size: 100 mm×20 mm) having an interconnection electrode disposed thereon (formation of an encapsulating resin layer: first sheet laminating step). Then, as illustrated in FIG. 3, four semiconductor elements 3 (size: 20 mm×10 mm) (three elements in the drawing) each having the interconnection electrode portion 2 (material: solder, 200 μm in diameter) were disposed on the encapsulating resin sheet 10 under heating and pressure (conditions: 175° C.×5 kg/cm²×60 sec), whereby the encapsulating resin sheet 10 was gelled and the connecting electrode portion 2 was inserted into the sheet to bring the interconnection electrode of the interconnection circuit substrate 1 into contact with the connecting electrode portions 2 of the semiconductor elements 3. In this manner, the semiconductor elements 3 were temporarily fixed onto the one side of the interconnection circuit substrate 1 by making use of the adhesive force caused by gelation of the encapsulating resin sheet 10 (first flip chip bonding step).

Next, as illustrated in FIG. 4, another encapsulating resin sheet 10 in the uncured form was placed at a predetermined position of the other side of the interconnection circuit substrate 1 on which another semiconductor elements 3 had not yet been temporarily fixed (formation of an encapsulating resin layer: second sheet laminating step). Then, as illustrated in FIG. 5, the same number of the another semiconductor elements 3 each having another interconnection electrode portion 2 were disposed on the another encapsulating resin sheet 10 under heating and pressure (conditions: 175° C.×5 kg/cm²×60 sec), whereby the another encapsulating resin sheet 10 was gelled and the another connecting electrode portion 2 was inserted into the sheet to bring the interconnection electrode of the interconnection circuit substrate 1 into contact with the connecting electrode portion 2 of the another semiconductor elements 3. In this manner, the another semiconductor elements 3 were temporarily fixed onto the other side of the interconnection circuit substrate 1 by making use of the adhesive force caused by gelation of the another encapsulating resin sheet 10 (second flip chip bonding step).

As illustrated in FIG. 6, the interconnection circuit substrate 1 having semiconductor elements 3 temporarily fixed on each side thereof was fed to a hot pressing step and heated and pressurized (conditions: 250° C.×0.2 kg/cm²×30 sec) between upper and lower plates P,P' of a hot press, whereby the connecting electrode portion 2 of the semiconductor elements 3 temporarily fixed on each of both sides of the interconnection circuit substrate 1 was connected with the interconnection electrode of the interconnection circuit substrate 1 by melting. At the same time, the encapsulating resin sheets 10 in the uncured form were each cured, thereby encapsulating therewith the space between the interconnection circuit substrate and semiconductor elements temporarily fixed on each side thereof to form encapsulating resin layers 4. In this manner, the semiconductor device as illustrated in FIG. 1 was fabricated.

The resulting semiconductor device was subjected to initial current carrying check and after the pressure cooker test [PCT test (conditions: left over for 200 hours at 121° C.×2 atom×100% RH)], it was subjected to current-carrying check again. The ratio of the appearance of defective (percent defective) was calculated. The device found to be defective was indicated by X, while that was found to be free from defective was indicated by O. The results are shown in Tables 4 and 5.

TABLE 4

|  |  | Examples | | | | | | | |
|---|---|---|---|---|---|---|---|---|---|
|  |  | 1 | 2 | 3 | 4 | 5 | 6 | 7 | 8 |
| Appearance of defective in current carrying test* | Initial | O (0) | O (0) | O (0) | O (0) | O (0) | O (0) | O (0) | O (0) |
|  | After 200 hrs' PCT test | O (0) | O (0) | O (0) | O (0) | O (0) | O (0) | O (0) | O (0) |

*The number in parenthesis indicates percent defective (%).

TABLE 5

|  |  | Examples | | | | |
|---|---|---|---|---|---|---|
|  |  | 9 | 10 | 11 | 12 | 13 |
| Appearance of defective in current-carrying test* | Initial | O (0) | O (0) | O (0) | O (0) | O (0) |
|  | After 200 hrs' PCT test | O (0) | O (0) | O (0) | O (0) | O (0) |

*The number in parenthesis indicates percent defective (%).

The results in Tables 4 and 5 show that no defective appeared in initial current carrying check and current carrying check 200 hours' PCT test. From the results, it has been found that in each Example, semiconductor elements had been mounted on each of both sides of the interconnection circuit substrate through the encapsulating resin layer and semiconductor device with high reliability was fabricated.

As described above, the semiconductor elements each having a connecting electrode portion are simultaneously or successively mounted on both sides of the interconnection circuit substrate through the encapsulating resin layers, respectively; and then the semiconductor elements were connected with the interconnection electrodes on both sides of the interconnection circuit substrate by making use of the adhesive force of the encapsulating resin layers, respectively, whereby the semiconductor device of the present invention is fabricated. According to the above-described process, it becomes possible to fabricate a double-side mounted type semiconductor device easily without a troublesome step, such as a step wherein connecting of electrodes and encapsulating with resin are carried out for each of the two sides of the interconnection circuit substrate. Thus, fabrication steps are drastically simplified, which brings about an improvement in the fabrication efficiency and cost reduction.

In the above-described fabrication process, as a step for mounting the semiconductor element having a connecting electrode portion on both sides of the interconnection circuit substrate through an encapsulating resin layer, for example, the semiconductor element is temporarily fixed onto one side of the interconnection circuit substrate through an encapsulating resin layer in the uncured form and then another semiconductor having a connecting electrode portion is temporarily fixed onto the other side gf the interconnection circuit substrate through another encapsulating resin layer in the uncured form. By such a temporarily fixing step, a double-side mounted type semiconductor device can be fabricated easily without a troublesome step, whereby drastic simplification of the fabrication steps can be actualized.

Moreover, by using, as the encapsulating resin layer, an encapsulating resin sheet formed of an epoxy resin composition which contains a predetermined amount of an inorganic filler having the maximum particle size adjusted to 100 $\mu$m or less, filling in the space between the substrate and semiconductor element can be carried out smoothly without causing voids and the like.

The double-side mounted type semiconductor device available by the process of the present invention which comprises simplified steps and has improved productivity meets the demand for a tendency to higher integration.

While the invention has been described in detail and with reference to specific embodiments thereof, it will be apparent to one skilled in the art that various changes and modifications can be made therein without departing from the spirit and-scope thereof.

What is claimed is:

1. A process for fabrication of a semiconductor device, comprising the steps of simultaneously or successively mounting at least one semiconductor element having a connecting electrode portion onto each of both sides of an interconnection circuit substrate through an encapsulating resin layer, and connecting said at least one semiconductor element with an interconnection electrode on each of both sides of said interconnection circuit substrate by adhesive force of said encapsulating resin layer.

2. The process according to claim 1, wherein said step of mounting at least one semiconductor element having a connecting electrode portion onto each of both sides of an interconnection circuit substrate through an encapsulating resin layer comprises simultaneously or successively mounting said at least one semiconductor element onto each of both sides of said interconnection circuit substrate through said encapsulating resin layer in an uncured form and temporarily fixing said at least one semiconductor element onto each of both sides of said interconnection circuit substrate by adhesive force of said encapsulating resin layer.

3. The process according to claim 2, wherein said step of simultaneously or successively mounting said at least one semiconductor element onto each of both sides of said interconnection circuit substrate through said encapsulating resin layer in the uncured form and temporarily fixing said at least one semiconductor element to each of both sides of said interconnection circuit substrate by adhesive force of said encapsulating resin layer comprises the steps of mounting at least one semiconductor element having a connecting electrode portion onto one side of said interconnection circuit substrate through an encapsulating resin layer in an uncured form; temporarily fixing said at least one semiconductor element to said one side of said interconnection circuit substrate by adhesive force of said encapsulating resin layer; mounting at least one other semiconductor element having an interconnection electrode portion onto another side of said interconnection circuit substrate through another encapsulating resin layer in an uncured form; and temporarily fixing said at least one other semiconductor element onto said other side of said interconnection circuit substrate by adhesive force of said another encapsulating resin layer.

4. The process according to claim 1, wherein each said encapsulating resin layer has been formed by an encapsulating resin sheet made of the following epoxy resin compositions (A):

(A) an epoxy resin composition comprising below-described components (a) to (c), said component (c) being contained in an amount of between 20 and 90 wt. % based on the whole epoxy composition (A):
(a) an epoxy resin,
(b) a phenol resin and
(c) an inorganic filler having a maximum particle size of 100 $\mu$m or less.

5. The process according to claim 2, wherein said encapsulating resin layers have each been formed by an encapsulating resin sheet made of the following epoxy resin compositions (A):

(A) an epoxy resin composition comprising below-described components (a) to (c), said component (c) being contained in an amount of between 20 and 90 wt. % based on the whole epoxy composition (A):
(a) an epoxy resin,
(b) a phenol resin and
(c) an inorganic filler having a maximum particle size of 100 $\mu$m or less.

6. The process according to claim 3, wherein said encapsulating resin layers have each been formed by an encapsulating resin sheet made of the following epoxy resin compositions (A):

(A) an epoxy resin composition comprising below-described components (a) to (c), said component (c) being contained in an amount of between 20 and 90 wt. % based on the whole epoxy composition (A):
(a) an epoxy resin,
(b) a phenol resin and
(c) an inorganic filler having a maximum particle size of 100 $\mu$m or less.

7. The process according to claim 1, wherein said step of connecting said at least one semiconductor element with an interconnection electrode on said interconnection circuit substrate comprises heating the whole body to melt said connecting electrode portion of said at least one semiconductor element, while temporarily fixed on each of both sides of said interconnection circuit substrate, thereby connecting with said interconnection electrode and at the same time, curing said encapsulation resin layer in uncured form.

* * * * *